(12) United States Patent
Yoon

(10) Patent No.: US 9,099,429 B2
(45) Date of Patent: Aug. 4, 2015

(54) HEAT SINK

(75) Inventor: Joo Won Yoon, Gyunggi-do (KR)

(73) Assignee: SAMSUNG ELECTRO-MECHANICS CO., LTD., Suwon (KR)

( * ) Notice: Subject to any disclaimer, the term of this patent is extended or adjusted under 35 U.S.C. 154(b) by 351 days.

(21) Appl. No.: 13/609,571

(22) Filed: Sep. 11, 2012

(65) Prior Publication Data
US 2013/0112682 A1 May 9, 2013

(30) Foreign Application Priority Data

Nov. 3, 2011 (KR) .......................... 10-2011-0113957

(51) Int. Cl.
H05B 3/50 (2006.01)
F28F 7/00 (2006.01)
H01L 23/40 (2006.01)

(52) U.S. Cl.
CPC ......... *H01L 23/40* (2013.01); *H01L 2924/0002* (2013.01)

(58) Field of Classification Search
CPC ................ H01L 23/40; H01L 23/4093; H01L 2924/0002; H01L 2924/00
USPC ........... 219/530; 165/185; 361/696, 697, 702, 361/704, 709–711
See application file for complete search history.

(56) References Cited

U.S. PATENT DOCUMENTS 5,865,413 A * 2/1999 Niemann et al. .............. 248/314
6,075,703 A 6/2000 Lee
6,820,753 B2 * 11/2004 Kurtz et al. .................... 211/53

FOREIGN PATENT DOCUMENTS

KR 1998-061575 11/1998
KR 1998-074621 11/1998
KR 1998-067685 12/1998

OTHER PUBLICATIONS

Korean Office Action issued Oct. 10, 2012 in corresponding Korean Patent Application No. 10-2011-0113957.

* cited by examiner

*Primary Examiner* — Sang Y Paik

(57) ABSTRACT

There is provided a heat sink including: a heat radiation plate having a heating element fixed to one surface thereof; a plurality of heat radiation fins formed on the other surface of the heat radiation plate to radiate heat generated in the heating element; a flange part provided on a heat radiation fin positioned in an outermost position among the plurality of heat radiation fins; and a fixing member inserted into the flange part to fix the heat sink to a printed circuit board, wherein the flange part is compressed in a predetermined position thereof, such that the fixing member and the flange part are coupled and fixed to each other.

5 Claims, 4 Drawing Sheets

HEAT SINK

CROSS-REFERENCE TO RELATED APPLICATIONS

This application claims the priority of Korean Patent Application No. 10-2011-0113957 filed on Nov. 3, 2011, in the Korean Intellectual Property Office, the disclosure of which is incorporated herein by reference.

BACKGROUND OF THE INVENTION

1. Field of the Invention

The present invention relates to a heat sink radiating heat from an electronic component to the outside, and more particularly, to a heat sink fixing structure fixing a heat sink to a printed circuit board.

2. Description of the Related Art

An electronic component such as a semiconductor chip, or the like, mounted in an electronic device generates a significant amount of heat during the operation of the electronic device. Since this heat deteriorates performance of the electronic component, such as a semiconductor chip, or the like, a heat sink is used in order to radiate the generated heat to the outside.

The heat sink may surface-contact one surface of the electronic component and radiate the heat generated in the electronic component to the outside.

As shown in FIG. 1, according to the related art, in order to fix a heat sink 10 to a printed circuit board (not shown), a scheme of press-fitting one side 21 of a heat sink fixing member 20 into coupling grooves 11 positioned at both ends of the heat sink 10 and coupling the other side 22 thereof to the printed circuit board (not shown) has been used.

Therefore, the fixing member 20 is always positioned at both ends of the heat sink 10, such that a size of the heat sink 10 is limited according to a size of a heat sink coupling groove (not shown) formed in the printed circuit board (not shown). As a result, limitations in adjusting the size of the heat sink 10 may arise.

In the case in which the size of the heat sink 10 is not adjusted, since additional processes such as a anodizing process, or the like, is required on a surface of the heat sink 10 in order to improve temperature characteristics, a price increase is caused. Therefore, improvement is required in order to adjust the size of the heat sink 10.

In addition, according to the related art, in order to allow the fixing member 20 to not be separated from the heat sink 10, the fixing member 20 has a hook shape formed on a portion of the side 21 thereof coupled to the heat sink 10 so as to be press-fitted into the heat sink 10.

In the case of press-fitting the fixing member 20 into the heat sink 10, aluminum fragments may be generated due to the hook shape of the portion of the one side 21 of the fixing member 20, which may causes a defect in the heat sink.

Therefore, in order to reduce a defect generation rate of the heat sink 10, it is necessary to improve a shape of the fixing member 20.

Meanwhile, in order to satisfy a demand for product miniaturization, it is necessary to improve a fixing structure fixing the heat sink 10 to the printed circuit board (not shown).

SUMMARY OF THE INVENTION

An aspect of the present invention provides a heat sink including a fixing member having an improved shape in order not to generate aluminum fragments when the fixing member is press-fitted to the heat sink and having a size capable of being adjusted regardless of a position of a heat sink coupling groove on a printed circuit board by allowing a position at which the fixing member is coupled to the heat sink to be adjusted.

According to an aspect of the present invention, there is provided a heat sink including: a heat radiation plate having a heating element fixed to one surface thereof; a plurality of heat radiation fins formed on the other surface of the heat radiation plate to radiate heat generated in the heating element; a flange part provided on a heat radiation fin positioned in an outermost position among the plurality of heat radiation fins; and a fixing member inserted into the flange part to fix the heat sink to a printed circuit board, wherein the flange part is compressed in a predetermined position thereof, such that the fixing member and the flange part are coupled and fixed to each other.

The flange part may be extended from an upper portion of the heat radiation plate and a free end of the heat radiation fin positioned in the outermost position among the plurality of heat radiation fins so as to face the heat radiation fin positioned in the outermost position among the plurality of heat radiation fins.

The flange part may be extended in a length direction of the heat radiation fin.

After the fixing member is inserted into the flange part and then moved to the predetermined position in the flange part, the flange part may be compressed in the predetermined position thereof, such that the fixing member and the flange part may be coupled and fixed to each other.

One surface of the heat radiation plate opposite to the other surface of the heat radiation plate on which the heat radiation fins are formed, may be provided with at least one fastening hole to allow the heating element to be fixed thereto.

The fixing member may include a flat part inserted into the flange part and a coupling part extended upwardly from the flat part in a vertical direction to be coupled to the printed circuit board and having a width smaller than that of the flat part.

The coupling part may include a protrusion part fixing the heat sink and the printed circuit board to each other by forming a coupling therebetween and a support part supporting the heat sink such that the heat sink is coupled to the printed circuit board while being spaced apart from the printed circuit board by a predetermined interval.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
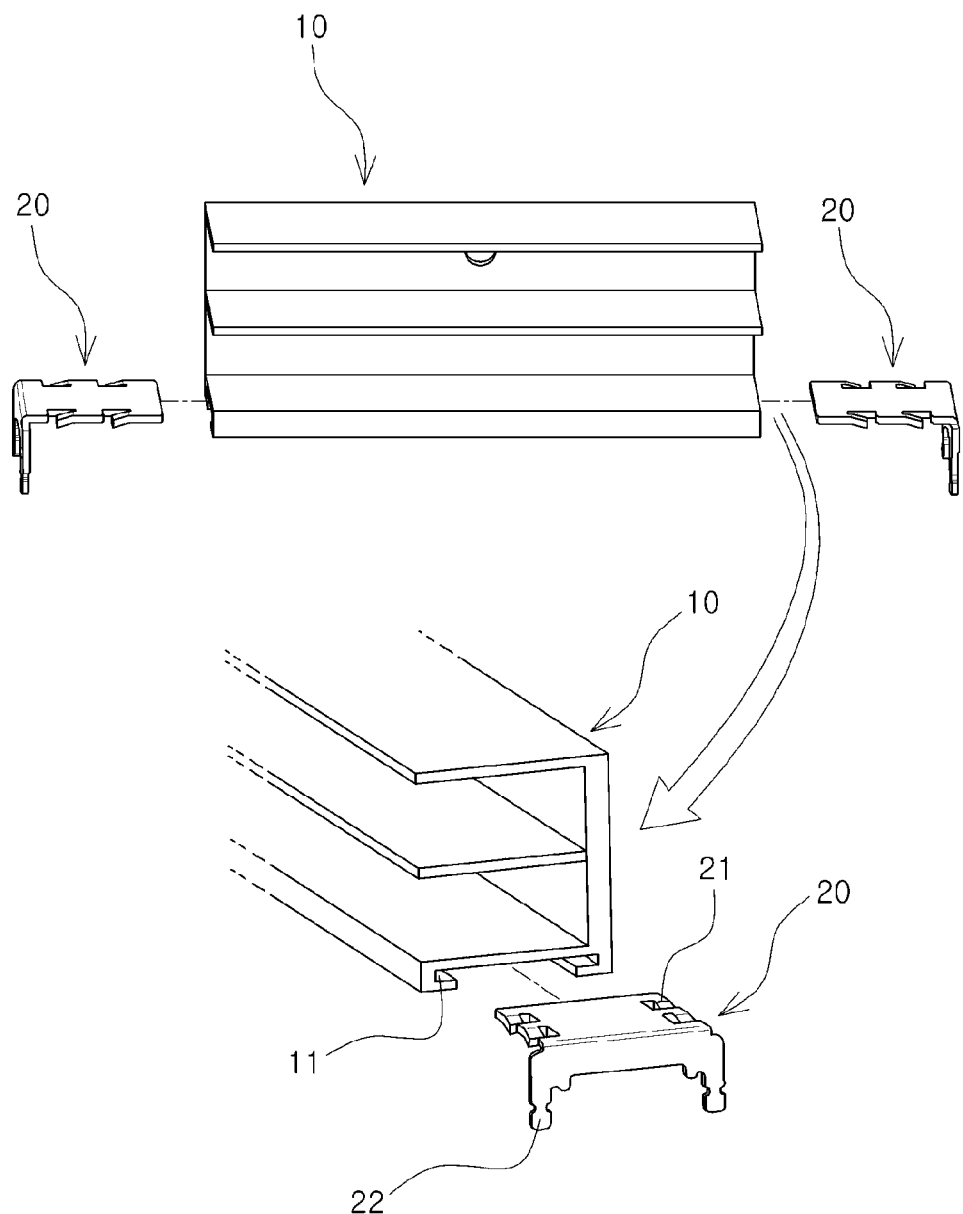
FIG. 1 is a perspective view showing a coupling relationship between a heat sink and a fixing member according to the related art.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

Figure 2:
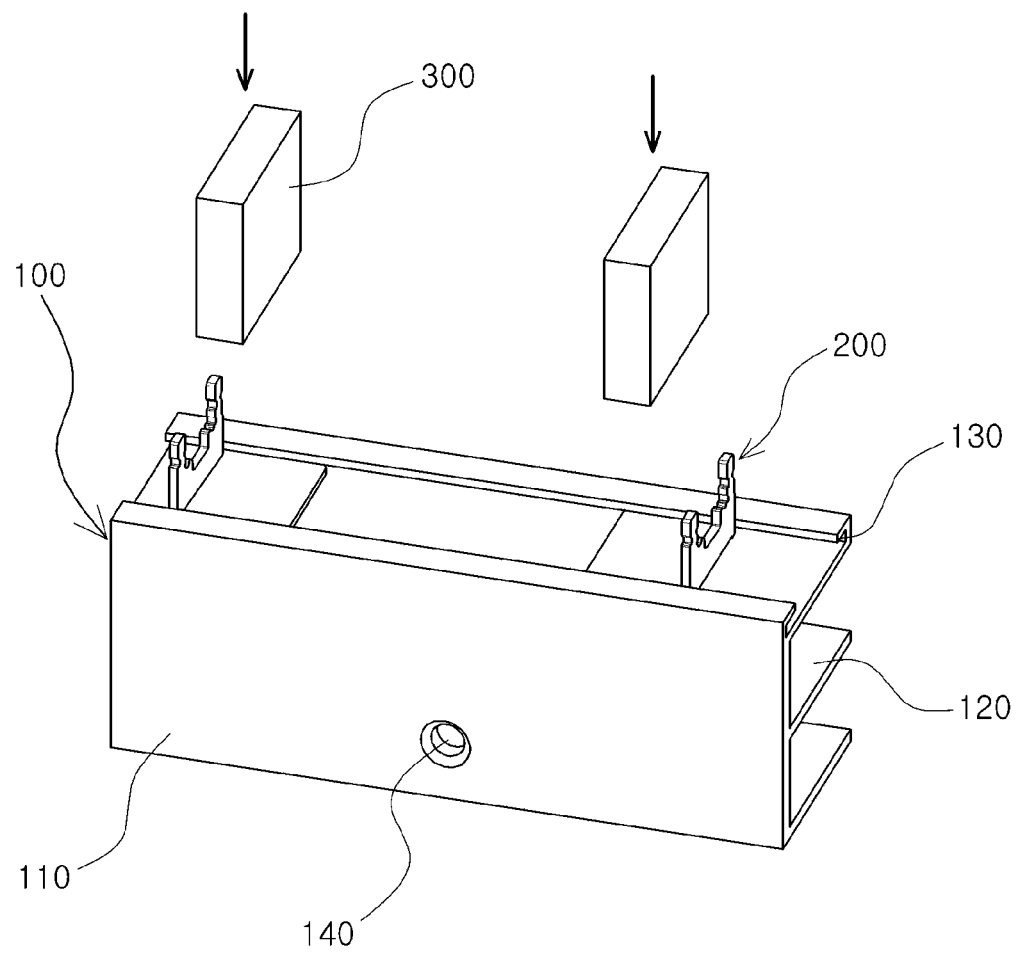
FIG. 2 is a perspective view of a heat sink, a fixing member, and a punching jig according to an embodiment of the present invention.
Figure 3:
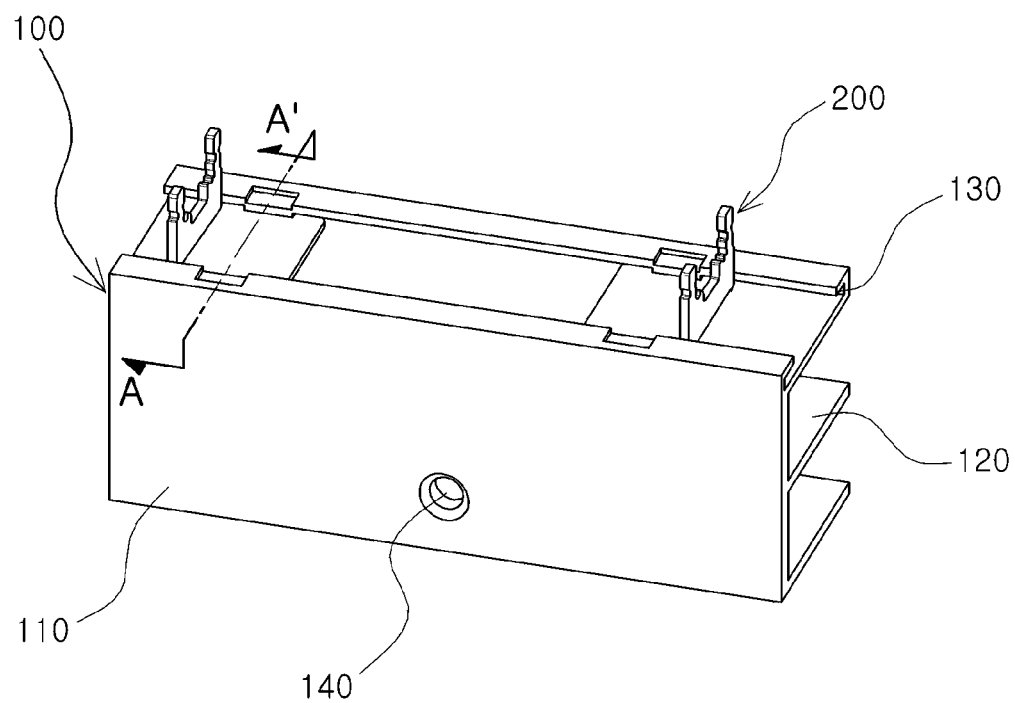
FIG. 3 is a perspective view showing a coupling relationship between a heat sink and a fixing member according to the embodiment of the present invention.

FIG. 2 is a perspective view of a heat sink, a fixing member, and a punching jig according to an embodiment of the present invention; FIG. 3 is a perspective view showing a coupling relationship between a heat sink and a fixing member according to the embodiment of the present invention; and FIG. 4 is a cross-sectional view taken along line A-A' of FIG. 3.

Figure 4:
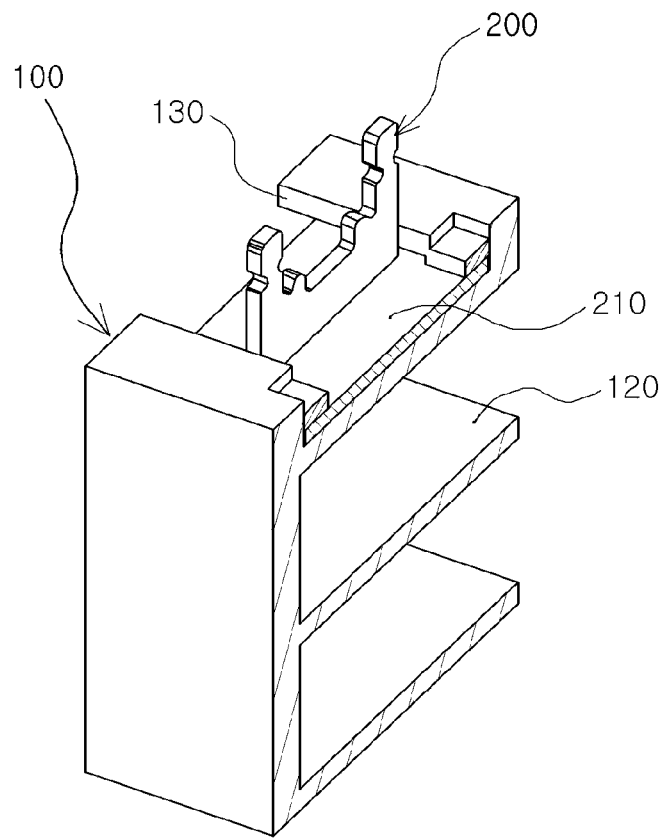
FIG. 4 is a cross-sectional view taken along line A-A' of FIG. 3.

Referring to FIGS. 2 through 4, a heat sink 100 according to the embodiment of the present invention may include a heat radiation plate 110 having a heating element (not shown) fixed to one surface thereof, a plurality of heat radiation fins 120 formed on the other surface of the heat radiation plate 110 to radiate heat generated in the heating element (not shown), a flange part 130 provided on a heat radiation fin positioned in an outermost position among the plurality of heat radiation fins 120, and a fixing member 200 inserted into the flange part 130 to fix the heat sink 100 to a printed circuit board.

The heat sink 100 according to the embodiment of the present invention may absorb heat from at least one heating element (not shown) generating heat and radiate the absorbed heat to the outside.

One surface of the heat radiation plate 110 may be provided with at least one fastening hole 140 such that the heating element (not shown) may be fixed to one surface of the heat radiation plate 110 included in the heat sink 100.

Here, the heating element (not shown) may be coupled to the fastening hole 140 in such a manner that one surface of the heating element (not shown) surface-contacts one surface of the heat radiation plate 110.

The fastening hole 140 may be formed to penetrate through the heat radiation plate 110, and a separate fastening member such as a screw, or the like, may be used to enable the heating element (not shown) to be fixed and fastened to the heat sink 100.

In the case in which the screw is used as the fastening member, a female thread may be formed in an inner peripheral surface of the fastening hole 140 so as allow the screw to be fastened thereto.

In addition, although the case in which the fastening hole 140 is formed to penetrate through the heat radiation plate 110 has been described by way of example in the present embodiment, a groove rather than a penetration hole may also be formed in the heat radiation plate 110 according to a thickness of the heat radiation plate 110.

The heat radiation plate 110 may have a flat plate shape, and include the plurality of heat radiation fins 120 formed on the other surface opposite to one surface of the heat radiation plate 110 to which the heating element (not shown) is fixed in such a manner that as large a surface area of the heat sink 100 as possible contacts the outside.

The plurality of heat radiation fins 120 may be formed to protrude outwardly from the other surface of the heat radiation plate 110 opposite to one surface thereof to which the heating element (not shown) is fixed. The heat radiation fins 120 may correspond to a size of the heat radiation plate 110 and provided in plural.

The plurality of heat radiation fins 120 may protrude as far as possible in such a manner that as large a surface area of the heat sink 100 as possible contacts the outside. In this case, the volume of the heat sink 100 may increase.

However, in the case, a problem in which the heat sink 100 may occupy a space for mounting other electronic components (not shown) occurs.

Therefore, the heat radiation fins 120 may be formed to have an appropriate form according to a heating degree of other electronic components (not shown) and a surrounding situation of the substrate (not shown) on which other electronic components (not shown) are mounted.

The flange part 130 may be provided on the heat radiation fin positioned in the outermost position among the plurality of heat radiation fins 120 and include the fixing member 200 insertedly coupled thereto in order to fix the heat sink 100 to the printed circuit board (not shown).

More specifically, the flange part 130 may be extended from an upper portion of the heat radiation plate and a free end of the heat radiation fin positioned in the outermost position so as to face the heat radiation fin positioned in the outermost position among the plurality of heat radiation fins.

Here, the free end of the heat radiation fin means a side of the heat radiation fin, opposite to a side on which the heat radiation fin contacts the heat radiation plate.

In addition, the flange part may be extended in a length direction of the heat radiation fin.

The fixing member 200 may include a flat part 210 inserted into the flange part 130 and a coupling part 220 extended upwardly from the flat part 210 in a vertical direction.

The coupling part 220 extended upwardly from the flat part 210 in the vertical direction may have a width smaller than that of the flat part 210 in order to allow the flat part 210 of the fixing member 200 to be inserted into the flange part 130 and then moved to a predetermined position in the flange part 130.

Meanwhile, the flat part 210 may have a flat plate shape such that the fixing member 200 may be inserted into the flange part 130 and then moved to a predetermined position in the flange part 130.

As described above, in the case in which the flat part of the fixing member has a hook shape according to the related art, when the fixing member is inserted into the flange part, aluminum fragments may be generated due to the hook shape of the fixing member. However, in the case in which the fixing member 200 according to the embodiment of the present invention is used, the generation of the aluminum fragments may be prevented.

After the fixing member 200 is inserted into the flange part 130 and then moved to the predetermined position therein, an upper portion of the flange part 130 may be compressed in the predetermined position thereof, into which the fixing member 200 is inserted, using a separate punching jig 300.

In this case, the flat part 210 of the fixing member 200 and the flange part 130 may be coupled and fixed to each other.

Since the fixing member according to the related art can only be positioned at both ends of the heat radiation plate, a heat sink coupling groove (not shown) on a printed circuit board can only be formed according to a size of the heat sink or the size of the heat sink can only be determined according to a position of the heat sink coupling groove (not shown) on the printed circuit board. However, in the case in which the fixing member 200 according to the embodiment of the present invention is used, since the position of the fixing member 200 may be freely determined in the flange part 130, the size of the heat sink 100 may be freely adjusted regardless of the position of the heat sink coupling groove (not shown) on the printed circuit board.

Figure 5:
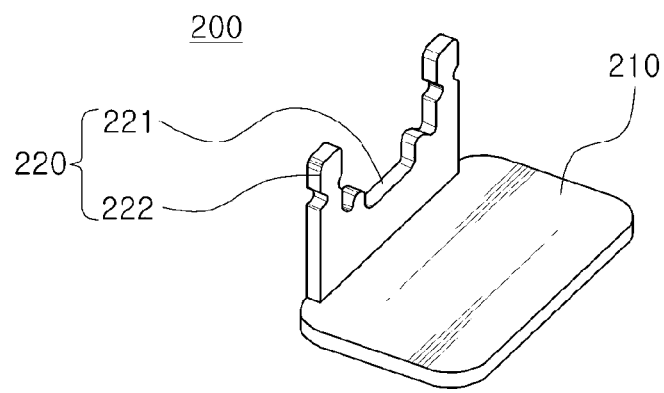
FIG. 5 is an enlarged perspective view of the fixing member according to the embodiment of the present invention.

FIG. 5 is an enlarged perspective view of the fixing member according to the embodiment of the present invention.

Referring to FIG. 5, the coupling part 220 of the fixing member 200 may include a protrusion part 222 fixing the heat sink 100 and the printed circuit board (not shown) to each other by forming a coupling therebetween and a support part 221 supporting the heat sink 100 such that the heat sink 100 is coupled to the printed circuit board (not shown) while being spaced apart from the printed circuit board (not shown) by a predetermined interval.

The protrusion part 222 may be extended upwardly from both distal ends of the support part 221 in a vertical direction and be coupled to the heat sink coupling groove on the printed circuit board (not shown) to fix the heat sink 100 to the printed circuit board (not shown).

When the heat sink 100 is fixed to the printed circuit board (not shown) by the fixing member 200, the support part 222 may support the heat sink 100 so as to be coupled to the printed circuit board (not shown) in a state in which the heat sink 100 is spaced apart from the printed circuit board (not shown) by the predetermined interval.

As described above, in the heat sink 100 according to the embodiment of the present invention, the flat part 210 of the fixing member 200 inserted into the flange part 130 has the flat plate shape, whereby defects in which aluminum fragments are generated in the case in which the flat part of the fixing member has the hook shape as in the scheme according to the related art may be solved, and the fixing member 200 is inserted into the flange part 130 and is then movable therein, whereby a coupling position between the fixing member 200 and the flange part 130 may be freely determined.

In addition, in the case in which the fixing member 200 according to the embodiment of the present invention is used, the position of the fixing member 200 in the flange part 130 may be freely determined, whereby the size of the heat sink 100 may be freely adjusted regardless of the position of the heat sink coupling groove (not shown) on the printed circuit board (not shown), and the heat sink coupling groove (not shown) on the printed circuit board (not shown) does not need to be configured according to the size of the heat sink 100, whereby drawing works of the printed circuit board (not shown) may be facilitated.

As set forth above, in accordance with the heat sink according to the embodiment of the present invention, the flat part of the fixing member inserted into the flange part of the heat sink has the flat plate shape, whereby the defect in which aluminum fragments are generated when the flat part of the fixing member has a hook shape, as in the scheme according to the related art, may be solved. In addition, after the fixing member is inserted into the flange part and then moved to the predetermined position therein, the flange part is compressed in the predetermined position thereof, such that the fixing member and the flange part are coupled and fixed to each other, whereby the size of the heat sink may be freely adjusted regardless of the position of the heat sink coupling groove on the printed circuit board. Further, the heat sink coupling groove on the printed circuit board does not need to be configured according to the size of the heat sink, whereby the drawing works of the printed circuit board may be facilitated.

While the present invention has been shown and described in connection with the embodiments, it will be apparent to those skilled in the art that modifications and variations can be made without departing from the spirit and scope of the invention as defined by the appended claims.

What is claimed is:

1. A heat sink comprising:
   a heat radiation plate having a heating element fixed to one surface thereof;
   a plurality of heat radiation fins formed on the other surface of the heat radiation plate to radiate heat generated in the heating element;
   a flange part provided on a heat radiation fin positioned in an outermost position among the plurality of heat radiation fins; and
   a fixing member inserted into the flange part to fix the heat sink to a printed circuit board, the flange part compressed in a predetermined position thereof such that the fixing member and the flange part are coupled and fixed to each other, and the fixing member including
      a flat part having a flat plate shape and inserted into the flange part, and
      a coupling part extended upwardly from the flat part in a vertical direction to be coupled to the printed circuit board and having a width smaller than that of the flat part, the coupling part including
         a protrusion part fixing the heat sink and the printed circuit board to each other by forming a coupling therebetween, and
         a support part supporting the heat sink such that the heat sink is coupled to the printed circuit board while being spaced apart from the printed circuit board by a predetermined interval.

2. The heat sink of claim 1, wherein the flange part is extended from an upper portion of the heat radiation plate and a free end of the heat radiation fin positioned in the outermost position among the plurality of heat radiation fins so as to face the heat radiation fin positioned in the outermost position among the plurality of heat radiation fins.

3. The heat sink of claim 1, wherein the flange part is extended in a length direction of the heat radiation fin.

4. The heat sink of claim 1, wherein after the fixing member is inserted into the flange part and then moved to the predetermined position in the flange part, the flange part is compressed in the predetermined position thereof, such that the fixing member and the flange part are coupled and fixed to each other.

5. The heat sink of claim 1, wherein one surface of the heat radiation plate opposite to the other surface of the heat radiation plate on which the heat radiation fins are formed, is provided with at least one fastening hole to allow the heating element to be fixed thereto.

\* \* \* \* \*